United States Patent
Tsutsumi

(10) Patent No.: US 8,550,677 B2
(45) Date of Patent: Oct. 8, 2013

(54) LIGHT EMITTING MODULE AND VEHICLE LAMP

(75) Inventor: Yasuaki Tsutsumi, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 407 days.

(21) Appl. No.: 12/950,174

(22) Filed: Nov. 19, 2010

(65) Prior Publication Data

US 2011/0121732 A1    May 26, 2011

(30) Foreign Application Priority Data

Nov. 20, 2009    (JP) .................................. 2009-265245

(51) Int. Cl.
*B60Q 1/04*    (2006.01)

(52) U.S. Cl.
USPC ..................... 362/539; 362/249.02; 362/465

(58) Field of Classification Search
USPC ................. 362/555, 465, 538, 539, 249.02
See application file for complete search history.

(56) References Cited

U.S. PATENT DOCUMENTS

| 4,948,214 A * | 8/1990 | Hamblen ...................... 359/654 |
| 2008/0291689 A1 | 11/2008 | Ajiki et al. |
| 2009/0213606 A1 | 8/2009 | Coushaine et al. |

FOREIGN PATENT DOCUMENTS

| CN | 1424221 A | 6/2003 |
| JP | 2001-266620 A | 9/2001 |
| JP | 2003-503253 A | 1/2003 |
| JP | 2003-045210 A | 2/2003 |
| JP | 2008-293852 A | 12/2008 |
| KR | 2008-0046689 A | 5/2008 |

OTHER PUBLICATIONS

Office Action for Korean Application No. 10-2010-0115226 issued Sep. 28, 2011, with English translation thereof (6 pages).
Chinese Office Action for Application No. 201010558186.4, mailed on Aug. 3, 2012 (11 pages).

* cited by examiner

*Primary Examiner* — David V Bruce
(74) *Attorney, Agent, or Firm* — Osha Liang LLP

(57) ABSTRACT

A light emitting module includes a plurality of light emitting units that emits light by using semiconductor light emitting elements, and a substrate that supports the plurality of arranged light emitting units. The light emitting units include light guide portions that guide light emitted by the semiconductor light emitting elements so that light emitted by the semiconductor light emitting elements is not directed at irradiation regions of adjacent light emitting units.

20 Claims, 20 Drawing Sheets

LIGHT EMITTING MODULE AND VEHICLE LAMP

TECHNICAL FIELD

The present invention relates to a light emitting module that includes a light emitting element such as a LED or the like.

BACKGROUND ART

In the past, there has been known a vehicle illumination device that includes a plurality of semiconductor light sources arranged in a matrix and achieves arbitrary light distribution by selectively turning on a specific portion of the semiconductor light sources (for example, see Patent Documents 1 to 3).

[Patent Document 1] JP-A-2003-45210
[Patent Document 2] JP-T-2003-503253
[Patent Document 3] JP-A-2001-266620

SUMMARY OF THE INVENTION

However, when a part of the semiconductor light sources is turned off for desired light distribution in the above-mentioned illumination device, there has been a possibility that light emitted from the semiconductor light sources, which are adjacent to the turned-off semiconductor light sources and are turned on, may leak to regions which are not irradiated with light, so as to correspond to the turned-off semiconductor light sources. For this reason, to a target object in the region that is not irradiated with light, the leaking light becomes a glare.

One or more embodiments of the invention provide a light emitting module that achieves desired light distribution characteristics with high accuracy.

In general, in one aspect, a light emitting module according to one or more embodiments of the invention comprises:

a plurality of light emitting units, each of which comprise semiconductor light emitting elements that emit light; and a substrate that supports the plurality of light emitting units in an arrangement, wherein the light emitting units include light guide portions that guide light emitted by the semiconductor light emitting elements so that light emitted by the semiconductor light emitting elements is not directed at irradiation regions of adjacent light emitting units.

According to this aspect, light emitted by the light emitting unit passes through the light guide portion corresponding to the light emitting unit. Accordingly, the leakage of light to the irradiation regions of the adjacent light emitting units is suppressed.

In general, in one aspect, a vehicle lamp according to one or more embodiments of the invention comprises:

the light emitting module as mentioned above; and a control circuit that individually controls the light of a plurality of semiconductor light emitting elements of the light emitting module.

According to this aspect, it is possible to achieve desired light distribution characteristics with high accuracy.

Other aspects and advantages of the invention will be apparent from the following description and the appended claims.

According to one or more embodiments of the invention, it is possible to achieve desired light distribution characteristics with high accuracy.

DETAILED DESCRIPTION

Figure 1:
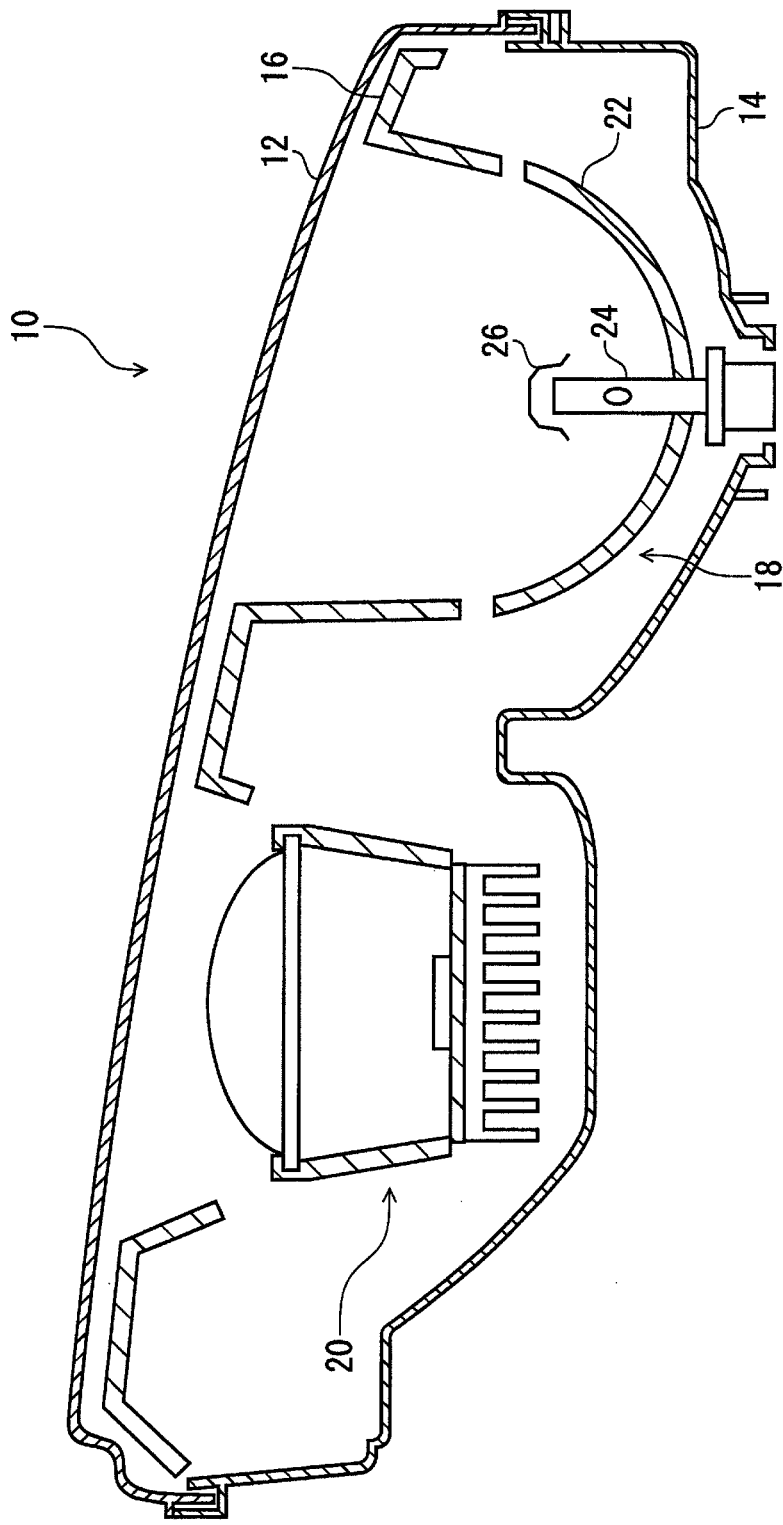
FIG. 1 is a schematic view of a lamp body unit of a vehicle headlamp device according to one or more embodiments.

Embodiments of the invention will be described in detail below with reference to drawings. Meanwhile, the same components are denoted by the same reference numerals in the drawings, and repeated description thereof will be appropriately omitted.

A vehicle headlamp device according to one or more embodiments includes a lamp unit that emits light capable of forming a part of regions of a high-beam light distribution pattern, and an irradiation controller that controls the light irradiation state of the lamp unit. Further, the irradiation controller controls the light irradiation state so that a part of the regions of the high-beam light distribution pattern is formed of at least partial regions divided into a plurality of regions in a vehicle width direction. Furthermore, a high-beam irradiation mode and a daytime lighting irradiation mode are switched by the individual adjustment of the intensity of the irradiation light corresponding to the respective partial regions, so that light intensity distribution suitable for the high-beam irradiation mode and light intensity distribution suitable for the daytime lighting irradiation mode are formed.

Figure 2:
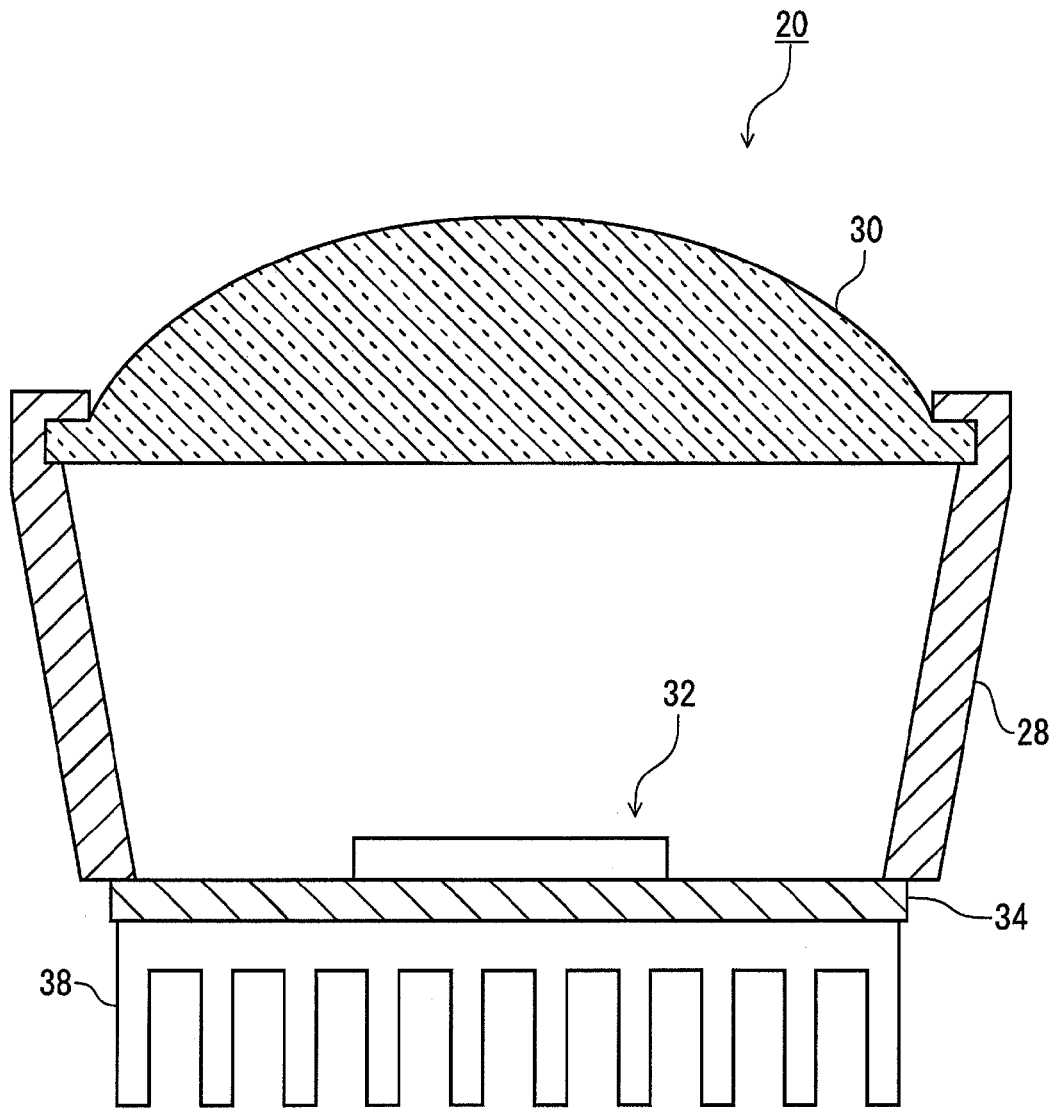
FIG. 2 is a view showing the structure of a second lamp unit that is included in the lamp body unit of the embodiment shown in FIG. 1.

FIG. 1 is a schematic view of a lamp body unit of the vehicle headlamp device according to one or more embodiments. The vehicle headlamp device according to the embodiment shown includes a pair of lamp body units that is provided on both left and right ends of a front portion of a vehicle in a vehicle width direction. Further, light distribution patterns formed by the left and right lamp body units are superimposed in front of the vehicle, so that the irradiation by the vehicle headlamp device is completed. FIG. 1 shows the structure of a lamp body unit 10, which is disposed on the right side, of the left and right lamp body units. FIG. 2 shows a cross-sectional view of the lamp body unit 10 that is taken along a horizontal plane and seen from above for easy understanding. The lamp body unit, which is disposed on the left side, is symmetrical to the lamp body unit 10 that is disposed on the right side. The basic structure of the lamp body unit, which is disposed on the left side, is the same as that of the lamp body unit 10. Accordingly, the lamp body unit 10 that is disposed on the right side will be described, and the description of the lamp body unit that is disposed on the left side will be omitted. Moreover, in the following description, for convenience, the side toward which the light of the lamp is emitted may be described as the front (front side) of a vehicle, and the side opposite thereto may be described as the rear (rear side) of a vehicle.

The lamp body unit 10 includes a translucent cover 12, a lamp body 14, an extension 16, a first lamp unit 18, and a second lamp unit 20. The lamp body 14 is made of a resin or the like, and is formed in the shape of a cup having an elongated opening. The translucent cover 12 is made of a translucent resin or the like, and is mounted on the lamp body 14 so as to close the opening of the lamp body 14. A space, which is substantially closed by the lamp body 14 and the translucent cover 12, is formed as a lamp chamber. The extension 16, the first lamp unit 18, and the second lamp unit 20 are disposed in this lamp chamber.

The extension 16 includes an opening through which irradiation light emitted from the first and second lamp units 18 and 20 passes, and is fixed to the lamp body 14. The first lamp unit 18 is disposed at an outer portion of the vehicle as compared with the second lamp unit 20 in the vehicle width direction. The first lamp unit 18 is a so-called parabolic lamp unit, and forms a low-beam light distribution pattern to be described below.

The first lamp unit 18 includes a reflector 22, a light source bulb 24, and a shade 26. The reflector 22 is formed in the shape of a cup, and has an insertion hole at the center thereof. In this embodiment, the light source bulb 24 is formed of an incandescent lamp, which includes a filament, such as a halogen lamp. Meanwhile, another type of light source such as a discharge lamp may be employed as the light source bulb 24. The light source bulb 24 is inserted into the insertion hole of the reflector 22 so as to protrude to the inside of the reflector, and is fixed to the reflector 22. The inner surface of the reflector 22 is formed in a curved shape so that the reflector reflects light emitted from the light source bulb 24 to the front side of the vehicle. The shade 26 blocks light that travels directly from the light source bulb 24 to the front side of the vehicle. Because the structure of the first lamp unit 18 is well known, a detailed description of the first lamp unit 18 will be omitted.

FIG. 2 is a view showing the structure of the second lamp unit 20 that is included in the lamp body unit 10 of the embodiment shown in FIG. 1. FIG. 2 shows a cross-sectional view of the lamp body unit 10 that is taken along a horizontal plane and seen from above. The second lamp unit 20 includes a holder 28, a projection lens 30, a light emitting module 32, and a heatsink 38. The second lamp unit 20 is a lamp unit that emits light capable of forming the entire high-beam light distribution pattern or a part of the regions of the high-beam light distribution pattern. That is, the second lamp unit 20 forms a high-beam light distribution pattern above a low-beam light distribution pattern, which is formed by the first lamp unit 18, in the high-beam irradiation mode. If the high-beam light distribution pattern is added to the low-beam light distribution pattern, the irradiation range is widened as a whole and also visibility is improved in the distance. Further, the second lamp unit 20 functions as a daytime lighting irradiation lamp, that is, a so-called daytime running lamp (DRL) that allows oncoming vehicles or pedestrians to easily recognize a vehicle in the daytime by emitting light alone in the daytime lighting irradiation mode.

The projection lens 30 is formed of a plano-convex aspheric lens of which the front surface is a convex surface and the rear surface is a flat surface. The projection lens projects a light source image, which is formed on the rear focal plane thereof, onto a virtual vertical screen, which is disposed on the front side of the lamp, as an inverted image. The projection lens 30 is mounted on one opening of the holder 28 that is formed in a cylindrical shape.

(First Embodiment)

Figure 3:
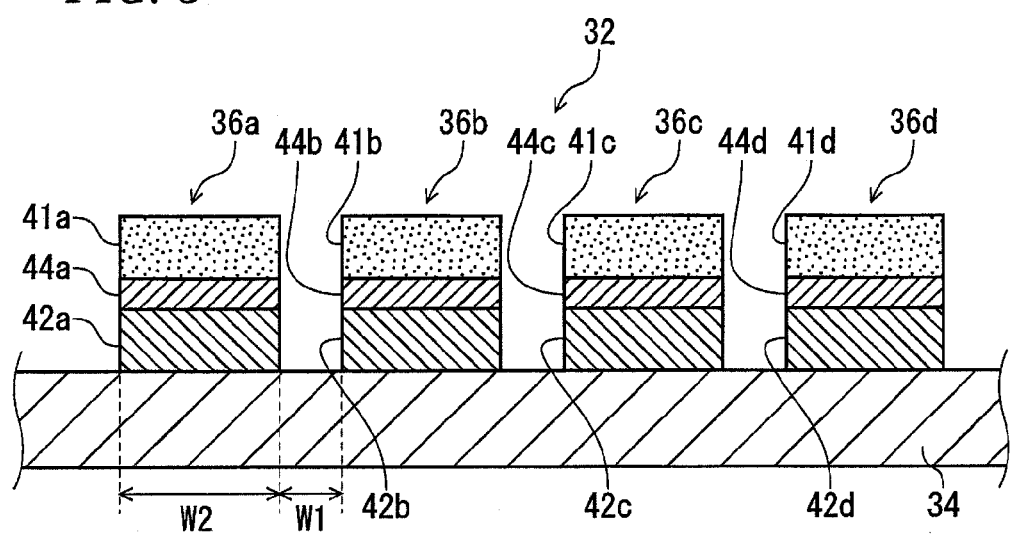
FIG. 3 is a cross-sectional view showing the main parts of a light emitting module according to a first embodiment.

FIG. 3 is a cross-sectional view showing the main parts of a light emitting module according to a first embodiment. A light emitting module 32 includes a first light emitting unit 36a, a second light emitting unit 36b, a third light emitting unit 36c, a fourth light emitting unit 36d, and a substrate 34 that supports the first to fourth light emitting units 36a to 36d. Meanwhile, the respective light emitting units 36a to 36d are generally referred to as light emitting units 36 when not being particularly distinguished from each other. The substrate 34 of this embodiment is a mounting substrate, and supports the plurality of light emitting units 36a to 36d.

The light emitting module 32 emits light corresponding to a high-beam light distribution pattern, and is adapted to be capable of selectively irradiating a part of a plurality of regions divided into a plurality of regions in the vehicle width direction. In the case of this embodiment, the high-beam light distribution pattern is formed of the respective irradiation regions that are divided so as to correspond to the first to fourth light emitting units 36a to 36d. Meanwhile, the number of the divided regions may be determined according to the performance required for the high-beam irradiation mode or the daytime lighting irradiation mode. For example, as long as the number of the divided regions is plural, the number of the divided regions may be larger or smaller than four and may be an odd number or even number.

The respective first to fourth light emitting units 36a to 36d are formed in a rectangular shape, and are linearly disposed on the substrate 34 in the order of the first to fourth light emitting units 36a to 36d so as to form the shape of a band. For example, the first to fourth light emitting units 36a to 36d may be formed of light sources of which light intensities can be individually controlled. That is, the second lamp unit 20 includes a multi-lamp light source.

Each of the light sources, which form the first to fourth light emitting units 36a to 36d, includes a semiconductor light emitting element, for example, an LED that has a square light emitting surface having a size of about 1 mm square, and the like. Of course, the light source of each of the light emitting units 36 is not limited thereto. For example, the light source of the light emitting unit may be a light source having the shape of another element that surface-emits light substantially in the shape of a spot, such as a laser diode. Further, the wavelength of the light emitted from the semiconductor light emitting element is not limited to a visible light range and may be in an ultraviolet range.

The heatsink 38 shown in FIG. 2 is made of metal such as aluminum so as to have a plurality of fins, and is mounted on the back of the substrate 34. If the first to fourth light emitting units 36a to 36d are formed of LED light sources as described above, it may be possible to accurately adjust the light emitting state of each of the light emitting units 36. As a result, it may be possible to achieve desired light distribution characteristics with high accuracy in the high-beam irradiation mode or the daytime lighting irradiation mode that will be described below.

The substrate 34 is mounted on the other opening of the holder 28 so that the first to fourth light emitting units 36a to 36d of the light emitting module 32 are disposed parallel to each other in the holder 28 in this order from the left side. Each of the first to fourth light emitting units 36a to 36d emits light, so that an image of each of the first to fourth light emitting units is projected onto a virtual vertical screen disposed on the front side of the lamp.

Figure 4:
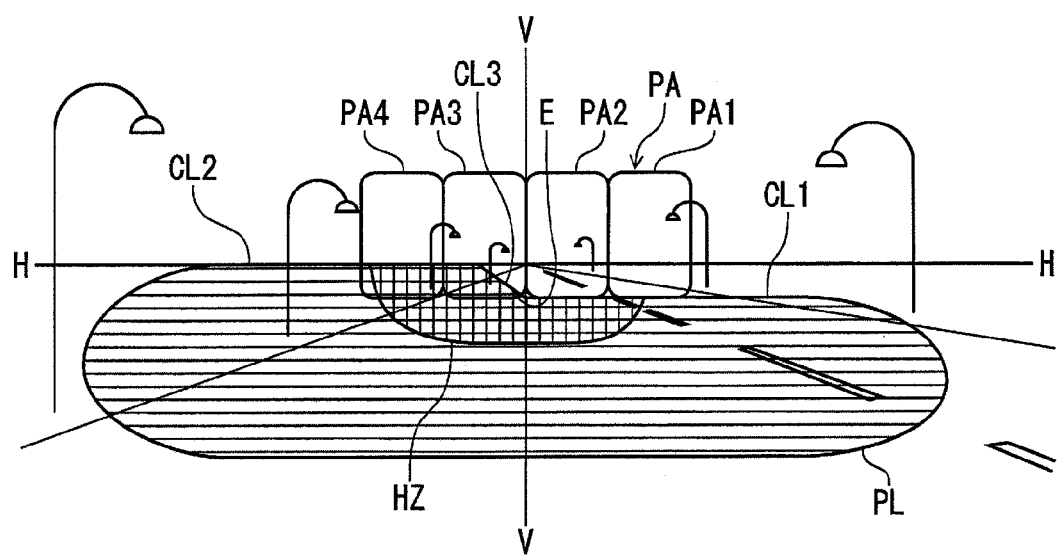
FIG. 4 shows a light distribution pattern which is formed on a virtual vertical screen, which is disposed, for example, at a position 25 meters (m) ahead of the vehicle, by the light that is emitted to the front side from the left and right lamp body units of the vehicle headlamp device according to one or more embodiments.

FIG. 4 shows a light distribution pattern. The light distribution pattern is formed on a virtual vertical screen, which is disposed, for example, at a position 25 m ahead of the vehicle, by the light that is emitted to the front side from the left and right lamp body units 10 of the vehicle headlamp device according to this embodiment.

The low-beam light distribution pattern PL is formed by the first lamp unit 18. The low-beam light distribution pattern PL is a left low-beam light distribution pattern used in a district where vehicles or pedestrians keep to the left, and includes first to third cutoff lines CL1 to CL3 at the upper edge of the low-beam light distribution pattern. The first and third cutoff lines CL1 and CL3 extend with a height difference in a horizontal direction on both left and right sides of a vertical line V-V, which is set in front of the lamp. The first cutoff line CL1 extends in a horizontal direction below a horizontal line H-H that is set on the right side of the vertical line V-V and in front of the lamp. For this reason, the first cutoff line CL1 is used as a cutoff line of an opposite lane.

The third cutoff line CL3 obliquely extends from the left end of the first cutoff line CL1 toward the left upper side by an inclination angle of, for example, 45°. The second cutoff line CL2 extends on the horizontal line H-H on the left side of an intersection between the third cutoff line CL3 and the horizontal line H-H. For this reason, the second cutoff line CL2 is used as a cutoff line of a traveling lane. Meanwhile, in the low-beam light distribution pattern PL, an elbow point E, which is an intersection between the first cutoff line CL1 and the vertical line V-V, is positioned below an intersection H-V by an angle of about 0.5 to 0.6°. Further, a hot zone HZ, which is a high-light intensity region, is formed so as to surround the elbow point E with slight bias to the left side by the shape adjustment or the like of the reflector 22. Accordingly, visibility is improved on the traveling lane.

An additional light distribution pattern PA, which is a part of regions of the high-beam light distribution pattern, is formed by the irradiation light emitted from the second lamp unit 20. The additional light distribution pattern PA is formed in the shape of a band that includes the horizontal line H-H and extends in the horizontal direction.

The additional light distribution pattern PA is divided into four rectangular regions, which are arranged side by side in the horizontal direction, according to the number of the light emitting units 36. Hereinafter, these regions are referred to as first to fourth partial regions PA1 to PA4 in this order from the right region, and a boundary between adjacent partial regions is referred to as a division line. A division line between the second and third partial regions PA2 and PA3 is set to 0° and corresponds to the vertical line V-V.

The first partial region PA1 is formed by the irradiation light of the first light emitting unit 36a. The second partial region PA2 is formed by the irradiation light of the second light emitting unit 36b. The third partial region PA3 is formed by the third light emitting unit 36c. The fourth partial region PA4 is formed by the fourth light emitting unit 36d.

In detail, as described below, the turning-on/off or light adjustment of the first to fourth light emitting units 36a to 36d or a plurality of grouped units of the first to fourth light emitting units may be individually performed on the basis of driver's operation or the information obtained from a device that is mounted on a vehicle and detects forward-positioned vehicles such as oncoming vehicles, vehicles traveling in front or pedestrians. Accordingly, it may be possible to obtain a plurality of light distribution patterns having different irradiation regions. Therefore, it may be possible to suppress glare directed at forward-positioned vehicles or pedestrians by turning off the light emitting unit 36 of the first to fourth partial regions PA1 to PA4 that irradiates a region where forward-positioned vehicles or pedestrians exist.

For example, if a subject vehicle and an oncoming vehicle traveling on the opposite lane exist, it may be possible to prevent glare from being directed at the driver of the oncoming vehicle by turning off the first light emitting unit 36a or the second light emitting unit 36b. Further, if there exists a preceding vehicle traveling in the same lane as a lane on which a subject vehicle is traveling, it may be possible to prevent glare from being directed at a driver of the preceding vehicle by turning off the second light emitting unit 36b or the third light emitting unit 36c. Furthermore, if there exists a pedestrian walking on a road side zone, it may be possible to prevent glare from being directed at the pedestrian by turning off the first light emitting unit 36a or the fourth light emitting unit 36d. It may be possible to secure a driver's visibility in the distance by turning off a part of the plurality of light emitting units 36 and turning on the rest thereof so that the driver of an oncoming vehicle, the driver of a preceding vehicle, or a pedestrian does not feel glare as described above.

Meanwhile, when one light distribution pattern is formed by the combination of the regions that are irradiated by the plurality of light emitting unit 36, it is preferable that a gap (unirradiated region) be not formed between the respective regions. From this point of view, the light emitting module 32 is formed so that the boundary portions of the irradiation regions of the respective light emitting units 36 overlap with each other. Meanwhile, if the area of the overlapping boundary portions of the respective irradiation regions is large, the light of the light emitting units 36, which are turned on, leaks into the irradiation regions of the light emitting units that are turned off when some light emitting units 36 are turned off and the other light emitting units 36 are turned on. As a result, glare is directed at vehicles traveling in front or pedestrians that exist in these regions.

Further, as a result of close examination, the inventors have discovered that an irradiation range of light is regulated if light emitted from a light emitting unit or a semiconductor light emitting element, which is turned on, passes through a light guide body. Accordingly, even if adjacent light emitting units or adjacent semiconductor light emitting elements are turned off, there is suppression of glare directed at vehicles traveling in front or pedestrians existing in the partial regions corresponding to the light emitting units or the semiconductor light emitting elements that are turned off. Furthermore, the inventors have discovered that a heat radiation property is improved if a light guide body is provided between an optical wavelength conversion member such as a phosphor and a semiconductor light emitting element. Accordingly, even if a light emitting unit is frequently turned on, the degradation of the light emitting element and the phosphor or the change of light emission characteristics caused by temperature rise is suppressed.

In this embodiment, the light guide body includes a translucent (transparent) material that transmits the light emitted by the light emitting unit or the semiconductor light emitting element. Examples of the translucent material include an organic material such as a transparent resin material, an inorganic material such as transparent inorganic glass, a mixture of an organic material and an inorganic material, a sol/gel material, and the like. Examples of the resin material include an acrylic resin, a polycarbonate resin, an epoxy resin, and the like.

Moreover, the surface of a transparent portion, which is made of the above-mentioned translucent material, of the light guide body may be covered with a material of which the refractive index is lower than the refractive index of the translucent material. In this case, very little of the light passing through the inside of the light guide body leaks to the outside due to total reflection. Further, a portion of the light guide body, which excludes a light incident surface and an emission surface, may be covered with a metal reflection film, a white composition, a dielectric multilayer film, a light blocking material absorbing light, or the like. In this case, light is prevented from leaking from a portion of the light guide body except for the light incident surface. Moreover, the light guide body may be a tubular member such as a hollow tube. Furthermore, the light guide body may be formed of one member, and may be formed of a bundle of a plurality of members such as optical fibers.

As shown in FIG. 3, the light emitting module 32 according to this embodiment includes the first to fourth light emitting units 36a to 36d. The first light emitting unit 36a includes a light guide body 41a, a semiconductor light emitting element 42a, and a phosphor layer 44a. The second light emitting unit 36b includes a light guide body 41b, a semiconductor light emitting element 42b, and a phosphor layer 44b. The third light emitting unit 36c includes a light guide body 41c, a semiconductor light emitting element 42c, and a phosphor layer 44c. The fourth light emitting unit 36d includes a light guide body 41d, a semiconductor light emitting element 42d, and a phosphor layer 44d.

A gap W1 between the light emitting units may be smaller than the width W2 of the light emitting unit. The gap W1 may be appropriately determined using experiments or pre-existing knowledge, so that a gap is not formed between the regions irradiated by the respective light emitting units. If the light emitting module is employed in a vehicle headlamp device, a gap W1 between the light emitting units may be set in the range of, for example, 50 to 500 μm.

Meanwhile, the first to fourth light emitting units 36a to 36d are appropriately referred to as light emitting units 36. Further, the light guide bodies 41a to 41d are appropriately referred to as light guide bodies 41. The semiconductor light emitting elements 42a to 42d are appropriately referred to as semiconductor light emitting elements 42. The phosphor layers 44a to 44d are appropriately referred to as phosphor layers 44.

Each of the light guide bodies 41 is disposed so as to cover the upper surface of each of the phosphor layers 44. Accordingly, light emitted from the semiconductor light emitting element 42 and the light, of which the wavelength is converted by the phosphor layer 44, of the light emitted from the semiconductor light emitting element 42 enter the light guide body 41. The light entering the light guide body 41 passes through the inside of the light guide body 41, so that diffusion of the light is suppressed. Accordingly, the leakage of the light, which is emitted from each of the light guide bodies 41, to predetermined irradiation regions of adjacent light emitting units 36 is suppressed. That is, the light emitted from each light emitting unit 36 passes through the light guide body 41 corresponding to the light emitting unit 36, so that the leakage of light to the irradiation regions of adjacent light emitting units 36 is suppressed. Accordingly, according to the light emitting module 32 of this embodiment, it may be possible to achieve desired light distribution characteristics with high accuracy. As a result, when some light emitting units 36 of the light emitting module 32 are turned off and the other light emitting units 36 are turned on, the leakage of light of the light emitting units 36, which are turned on, to the irradiation regions of the light emitting units 36, which are turned off, is suppressed. Therefore, the circumstances contributing to the glare, which is directed at vehicles traveling in front or pedestrians existing in the regions, are improved.

Figure 5:
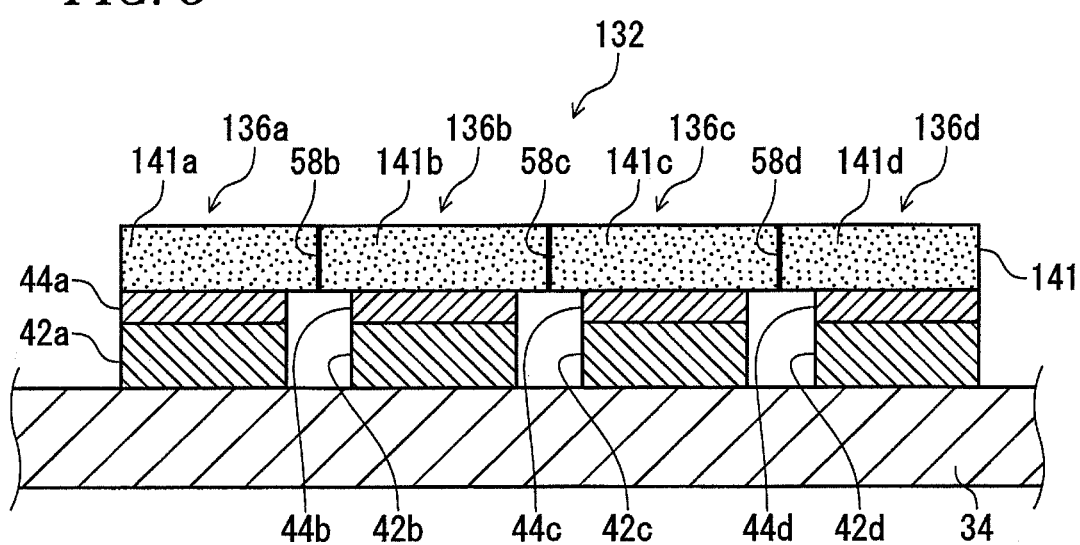
FIG. 5 is a cross-sectional view showing the main parts of a modification of the light emitting module according to the first embodiment.

FIG. 5 is a cross-sectional view showing the main parts of a modification of the light emitting module according to the first embodiment. The primary differences between the structure of this modification and the structure of the light emitting module 32 shown in FIG. 3 will be described below. A light emitting module 132 includes first to fourth light emitting units 136a to 136d. Further, the light emitting module 132 includes a light guide body 141 that integrally covers upper portions of phosphor layers 44a to 44d of the first to fourth light emitting units 136a to 136d (hereinafter, appropriately referred to as light emitting units 136).

The light guide body 141 is partitioned into a plurality of regions 141a to 141d facing the respective phosphor layers 44. Light blocking portions 58b to 58d are formed at boundaries between the respective regions 141a to 141d. Accordingly, even though a part of the light, which is emitted from the phosphor layer 44a and enters the region 141a of the light guide body 141, is directed at the adjacent region 141b, the light is blocked by the light blocking portion 58b. Further, even though a part of the light, which is emitted from the phosphor layer 44b and enters the region 141b of the light guide body 141, is directed at the adjacent regions 141a and 141c, the light is blocked by the light blocking portions 58b and 58c. Furthermore, even though a part of the light, which is emitted from the phosphor layer 44c and enters the region 141c of the light guide body 141, is directed at the adjacent regions 141b and 141d, the light is blocked by the light blocking portions 58c and 58d. Moreover, even though a part of the light, which is emitted from the phosphor layer 44d and enters the region 141d of the light guide body 141, is directed at the adjacent region 141c, the light is blocked by the light blocking portion 58*d*. As a result, the light emitting module 132 has the same advantages as the advantages mentioned in the description of the light emitting module 32. In addition, because the light guide body 141, which is integrally formed, is provided on the respective phosphor layers 44, it may be possible to easily manufacture a light emitting module as compared with when light guide bodies are provided on the light emitting units 36, respectively.

As long as the material that is filled in the light blocking portion, or the structure of the light blocking portion prevents at least incident light from being transmitted as it is, any material or structure may be used. It is preferable that a material having a light transmittance lower than the transmittance of at least the light guide body 141 be used as the material filled in the light blocking portion. The material filled in the light blocking portion is appropriately selected from various opaque materials, such as a resin composition, metal, and a dielectric. Meanwhile, the opaque material may be a material that does not need absorb light in the entire wavelength range of an electromagnetic wave and absorb light at least in the wavelength range of the light emitted from the semiconductor light emitting element. For example, the opaque material may be a material that selectively blocks ultraviolet light or blue light emitted by the semiconductor light emitting element and yellow light emitted from the phosphor.

Further, the light blocking portion may be a member that functions as a reflecting member. For example, a dielectric, metal, a resin composition having high reflectance, or the like may be used. Furthermore, the light blocking portion may be a metal film or a dielectric thin film that is formed at a boundary surface between the light blocking portion and the phosphor layer. For example, a reflection film, which is formed by superimposing a plurality of dielectric thin films having a high refractive index and dielectric thin films having a low refractive index, may be formed on the light blocking portion. Moreover, light may be reflected on the surface of the light blocking portion by the difference between the refractive index of the phosphor layer and the refractive index of the light blocking portion. In this case, the refractive index of the material, which is filled in the light blocking portion, may be lower than the refractive index of a material of the phosphor layer. Further, the shape of the cross-section of the light blocking portion is not limited to a polygonal shape such as a rectangular shape, and may be a thin shape like the shape of the light blocking portion shown in FIG. 5.

Examples of a material used for the optical wavelength conversion member include a glass composition, or a resin composition where phosphor powder is dispersed, and a fluorescent ceramic to be described below. In particular, a fluorescent ceramic, which is an inorganic material, is easily formed in various shapes or is machinable with high accuracy. For this reason, the fluorescent ceramic is suitable to be used as, particularly, a plate-like optical wavelength conversion member. The above-mentioned LED is suitable as the semiconductor light emitting element, but the light emission wavelength of the semiconductor light emitting element may be in not only a visible light range, but also, an ultraviolet light.

Figure 6:
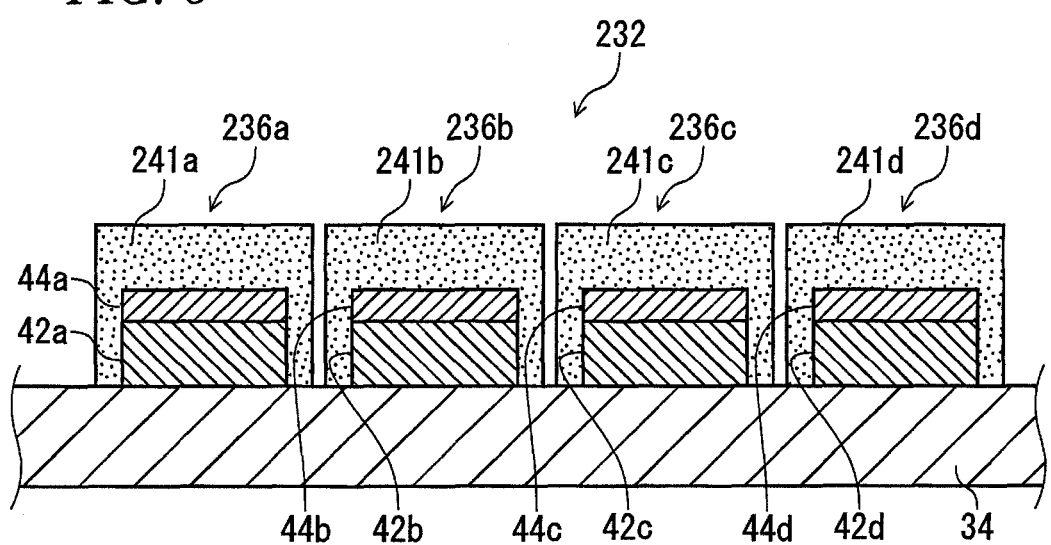
FIG. 6 is a cross-sectional view showing the main parts of another modification of the light emitting module according to the first embodiment.

FIG. 6 is a cross-sectional view showing the main parts of another modification of the light emitting module according to the first embodiment. The difference between the structure of this other modification and the structures of the light emitting modules 32 and 132 shown in FIGS. 3 and 5 will, in the main, be described below. A light emitting module 232 includes light guide bodies 241*a* to 241*d* corresponding to first to fourth light emitting units 236*a* to 236*d* (hereinafter, appropriately referred to as light emitting units 236). The light guide body 241*a* completely covers the upper surface of a phosphor layer 44*a* and side surfaces of a semiconductor light emitting element 42*a* and the phosphor layer 44*a*. The light guide body 241*b* completely covers the upper surface of a phosphor layer 44*b* and side surfaces of a semiconductor light emitting element 42*b* and the phosphor layer 44*b*. The light guide body 241*c* completely covers the upper surface of a phosphor layer 44*c* and side surfaces of a semiconductor light emitting element 42*c* and the phosphor layer 44*c*. The light guide body 241*d* completely covers the upper surface of a phosphor layer 44*d* and side surfaces of a semiconductor light emitting element 42*d* and the phosphor layer 44*d*.

Accordingly, the light emitting module 232 has the same advantages as the advantages mentioned in the description of the light emitting module 32. Further, because the side surfaces of the respective semiconductor light emitting elements 42 are covered with the respective light guide bodies 241*a* to 241*d* in the light emitting module 232, it may also be possible to effectively use the light, which is emitted from the side surfaces of the respective semiconductor light emitting elements 42, to irradiate the front side. Meanwhile, the respective light guide bodies 241*a* to 241*d* may be integrally formed. In this case, a light blocking portion may be formed at the boundary of each of the light guide bodies.

Figure 7:
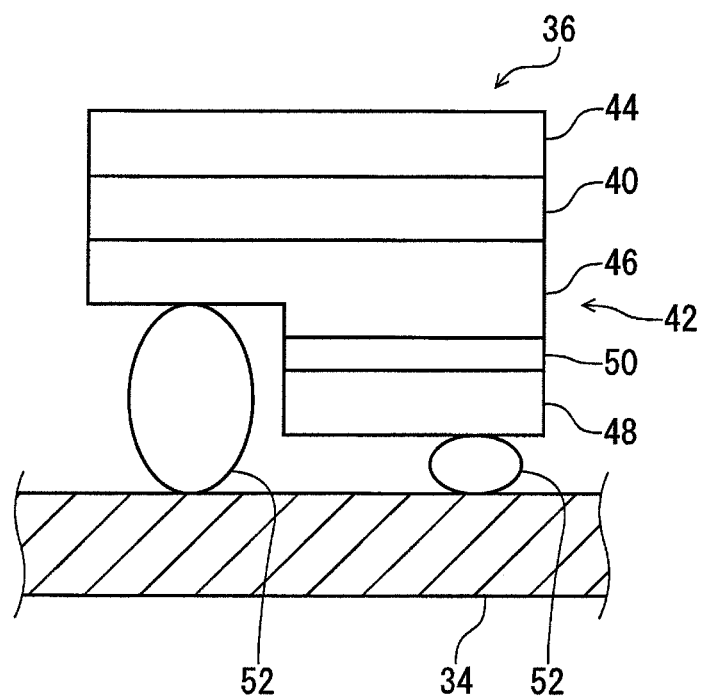
FIG. 7 is a cross-sectional view showing an example of a light emitting unit that is suitable for the embodiment shown in FIG. 6.

The light emitting unit 36 including the semiconductor light emitting element 42 will be described in more detail below. Meanwhile, because the structures of the above-mentioned light emitting units 136 and 236 are substantially the same as the structure of the light emitting unit 36, the description of the above-mentioned light emitting units 136 and 236 will be omitted. FIG. 7 is a cross-sectional view showing an example of a light emitting unit that is suitable for this embodiment. The light emitting unit 36 includes a growth substrate 40, the semiconductor light emitting element 42 grown on the growth substrate 40, and the phosphor layer 44. The light emitting unit 36 is supported by the substrate 34. The material of the substrate 34 is appropriately selected from, for example, a glass epoxy resin, a polyimide resin, stainless steel such as SUS, Cu, AlN, SiC, Si, and the like. It is preferable that the growth substrate 40 be a crystal having an appropriate lattice constant for the production of the semiconductor light emitting element 42 and have translucency. In the light emitting unit 36 according to this embodiment, sapphire is used as a material of the growth substrate 40.

In the light emitting unit 36 shown in FIG. 7, the plate-like phosphor layer 44 is provided so as to face the light emitting surface of the semiconductor light emitting element 42 with the growth substrate 40 interposed between the phosphor layer and the semiconductor light emitting element. The semiconductor light emitting element 42 is formed of an LED. In this embodiment, a blue LED, which mainly emits light corresponding to a blue light wavelength, is employed as the semiconductor light emitting element 42. Specifically, the semiconductor light emitting element 42 includes a n-type semiconductor layer 46 and a p-type semiconductor layer 48, which are grown on the growth substrate 40 made of sapphire, and a light emitting layer 50 that is formed between the n-type semiconductor layer and the p-type semiconductor layer. Further, because the semiconductor light emitting element 42 mainly emits light at the light emitting layer 50, the upper surface of the light emitting layer 50 may be regarded as a light emitting surface. The semiconductor light emitting element 42 is flip-chip mounted on the substrate 34 by bumps 52. Of course, the structure of the semiconductor light emitting element 42 and the wavelength of the light emitted from the semiconductor light emitting element are not limited to the above-mentioned structure and wavelength.

The phosphor layer 44 is an optical wavelength conversion member, and is formed of at least an optical wavelength conversion ceramic. The optical wavelength conversion ceramic is formed in the shape of a plate having a thickness that is equal to or larger than 1 μm and smaller than 5000 μm, preferably, a thickness that is equal to or larger than 10 μm and smaller than 1000 μm, and is then machined to a size corresponding to the size of the semiconductor light emitting element 42. Of course, the size of the optical wavelength conversion ceramic is not limited thereto.

The optical wavelength conversion ceramic is called a so-called light emitting ceramic or fluorescent ceramic, and may be obtained by sintering a ceramic base metal made of YAG (Yttrium Aluminium Garnet) powder that is a phosphor excited by blue light. Since a method of manufacturing the optical wavelength conversion ceramic is well known, the detailed description thereof will be omitted. The optical wavelength conversion ceramic, which is obtained as described above, can suppress light diffusion on the surface of powder unlike, for example, a powder-like phosphor, so that the loss of light emitted by the semiconductor light emitting element 42 is very small.

The optical wavelength conversion ceramic emits yellow light by converting the wavelength of blue light that is mainly emitted by the light emitting element 42. For this reason, combined light, which is formed by combining the blue light transmitted through the phosphor layer 44 as is with yellow light of which the wavelength is converted by the optical wavelength conversion ceramic, is emitted from the light emitting unit 36. In this way, the light emitting unit 36 can emit white light.

Meanwhile, an element, which mainly emits light corresponding to wavelengths other than the blue light wavelength, may be employed as the semiconductor light emitting element 42. Even in this case, an element, which converts the wavelength of the light mainly emitted by the semiconductor light emitting element 42, is employed as the optical wavelength conversion ceramic. Meanwhile, even in this case, the optical wavelength conversion ceramic may convert the wavelength of light emitted by the semiconductor light emitting element 42 so that white light or colored light similar to white light is formed by the combination with the light mainly emitted from the semiconductor light emitting element 42.

(Second Embodiment)

Figure 8:
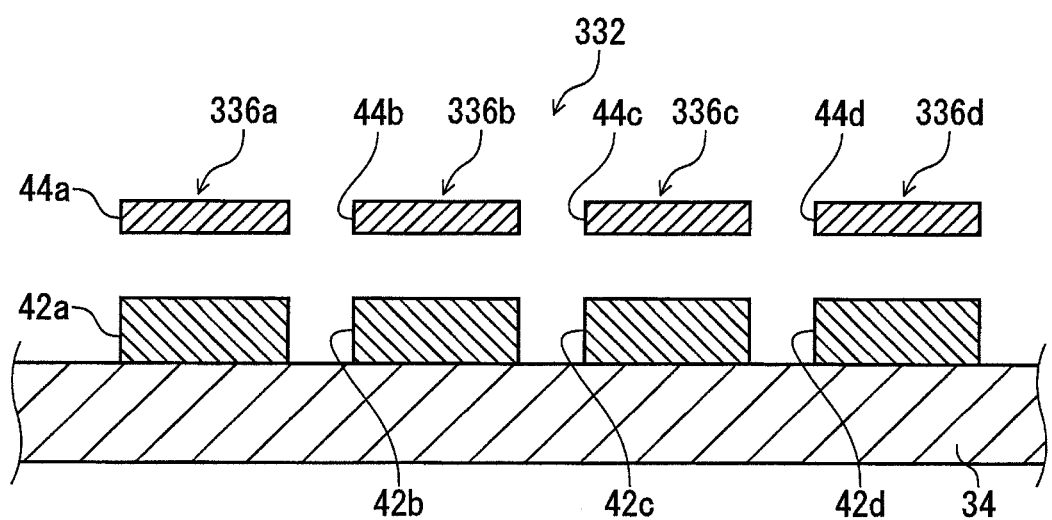
FIG. 8 is a cross-sectional view showing the main parts of a light emitting module according to a second embodiment.

FIG. 8 is a cross-sectional view showing the main parts of a light emitting module according to a second embodiment. Meanwhile, the same structure and advantages as those of the first embodiment will be appropriately omitted. A light emitting module 332 according to this embodiment includes first to fourth light emitting units 336a to 336d. The first light emitting unit 336a includes a semiconductor light emitting element 42a and a phosphor layer 44a. The second light emitting unit 336b includes a semiconductor light emitting element 42b and a phosphor layer 44b. The third light emitting unit 336c includes a semiconductor light emitting element 42c and a phosphor layer 44c. The fourth light emitting unit 336d includes a semiconductor light emitting element 42d and a phosphor layer 44d. In each of the light emitting units, the semiconductor light emitting element 42 and the phosphor layer 44 are spaced apart from each other. Accordingly, the heat radiation property of the semiconductor light emitting element 42 or the phosphor layer 44 is improved, so that the characteristics of the entire light emitting module are improved.

Figure 9:
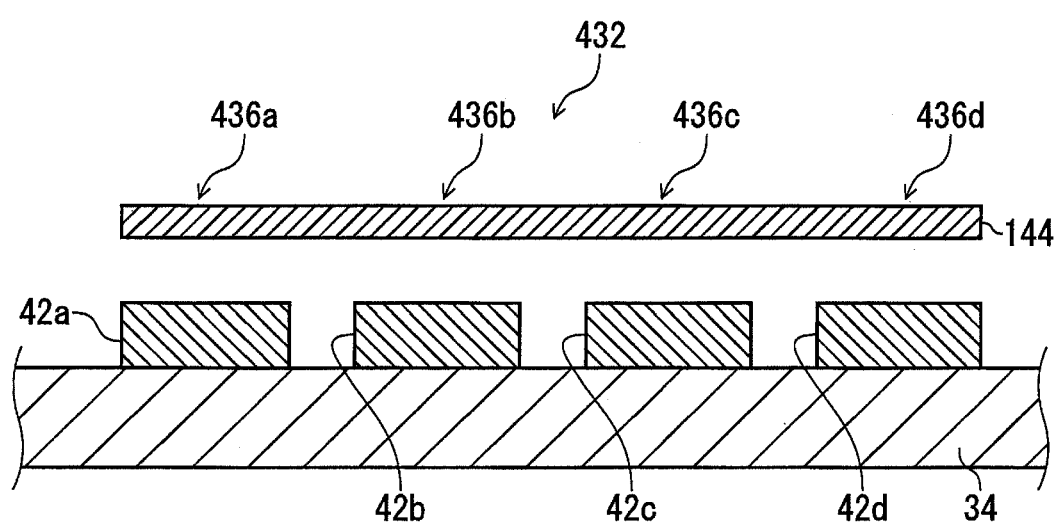
FIG. 9 is a cross-sectional view showing the main parts of a modification of the light emitting module according to the second embodiment.

FIG. 9 is a cross-sectional view showing the main parts of a modification of the light emitting module according to the second embodiment. A light emitting module 432 includes a phosphor layer 144, which is common to first to fourth light emitting units 436a to 436d, unlike the light emitting module 332 shown in FIG. 8. Accordingly, it may be possible to position the phosphor layer 144 relative to a plurality of semiconductor light emitting elements 42 in a single operation.

(Third Embodiment)

Figure 10:
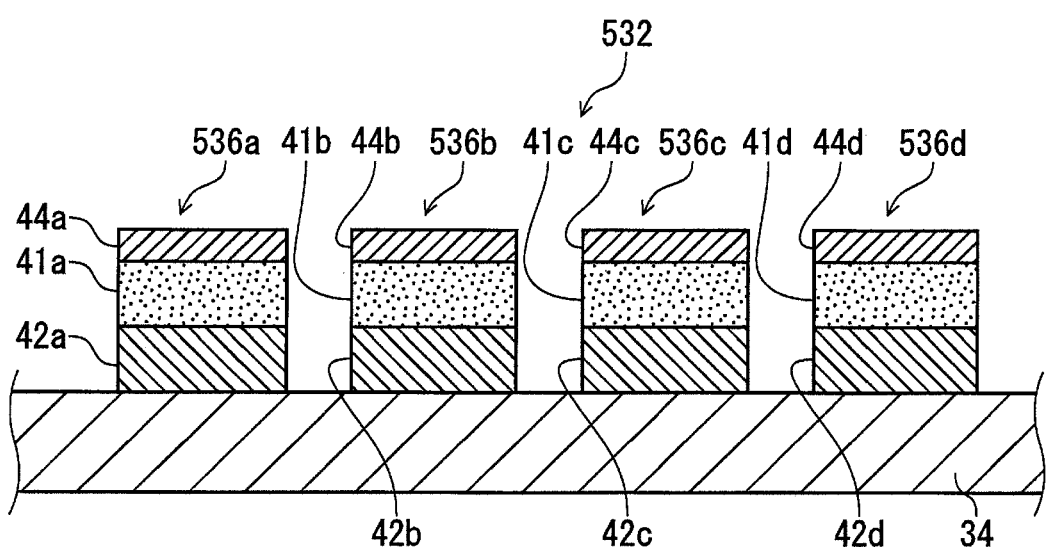
FIG. 10 is a cross-sectional view showing the main parts of a light emitting module according to a third embodiment.

FIG. 10 is a cross-sectional view showing the main parts of a light emitting module according to a third embodiment. Meanwhile, the same structure and advantages as those of the above-mentioned respective embodiments will be appropriately omitted. A light emitting module 532 according to this embodiment includes first to fourth light emitting units 536a to 536d, and is different from the light emitting module 32 according to the first embodiment in that light guide bodies 41a to 41d are disposed between semiconductor light emitting elements 42a to 42d and phosphor layers 44a to 44d, respectively. According to this structure, light emitted by each of the semiconductor light emitting elements 42 passes through the corresponding light guide body 41, so that the diffusion of the light is suppressed. Further, because the semiconductor light emitting element 42 and the phosphor layer 44 are spaced apart from each other, the heat radiation property of the semiconductor light emitting element 42 or the phosphor layer 44 is improved, so that the characteristics of the entire light emitting module are improved.

Figure 11:
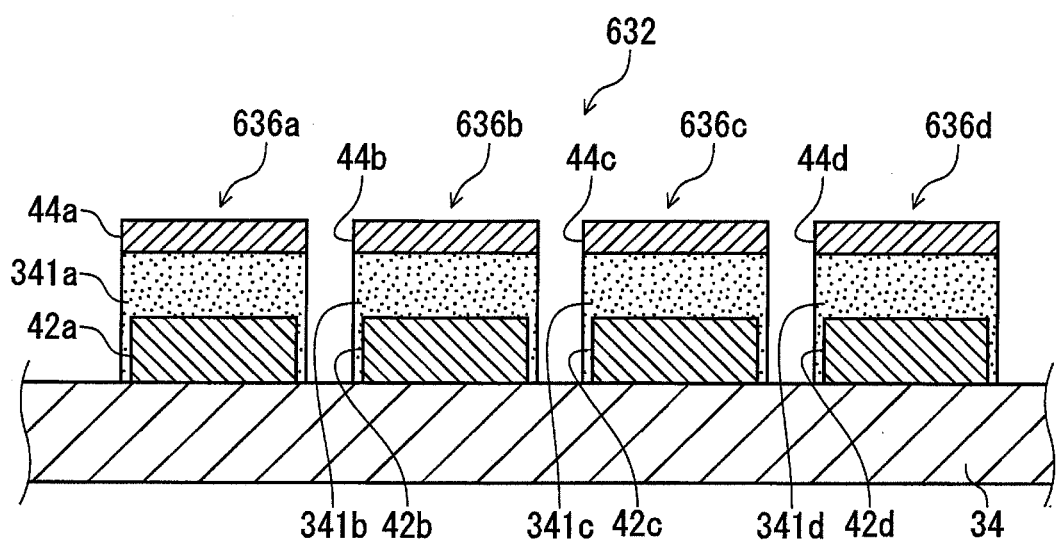
FIG. 11 is a cross-sectional view showing the main parts of a modification of the light emitting module according to the third embodiment.

FIG. 11 is a cross-sectional view showing the main parts of a modification of the light emitting module according to the third embodiment. The primary differences between the structure of this modification and the structure of the light emitting module 532 shown in FIG. 10 will be described below. A light emitting module 632 includes light guide bodies 341a to 341d corresponding to first to fourth light emitting units 636a to 636d (hereinafter, appropriately referred to as light emitting units 636). The light guide body 341a is provided so as to cover the upper surface and side surfaces of a semiconductor light emitting element 42a. A phosphor layer 44a is laminated on the upper surface of the light guide body 341a. The light guide body 341b is provided so as to cover the upper surface and side surfaces of a semiconductor light emitting element 42b. A phosphor layer 44b is laminated on the upper surface of the light guide body 341b. The light guide body 341c is provided so as to cover the upper surface and side surfaces of a semiconductor light emitting element 42c. A phosphor layer 44c is laminated on the upper surface of the light guide body 341c. The light guide body 341d is provided so as to cover the upper surface and side surfaces of a semiconductor light emitting element 42d. A phosphor layer 44d is laminated on the upper surface of the light guide body 341d.

Accordingly, the light emitting module 632 has the same advantages as the advantages mentioned in the description of the light emitting module 532. Further, since the side surfaces of the respective semiconductor light emitting elements 42 are covered with the respective light guide bodies 341a to 341d in the light emitting module 632, it may also be possible to effectively use the light, which is emitted from the side surfaces of the respective semiconductor light emitting elements 42, to irradiate the front side.

Figure 12:
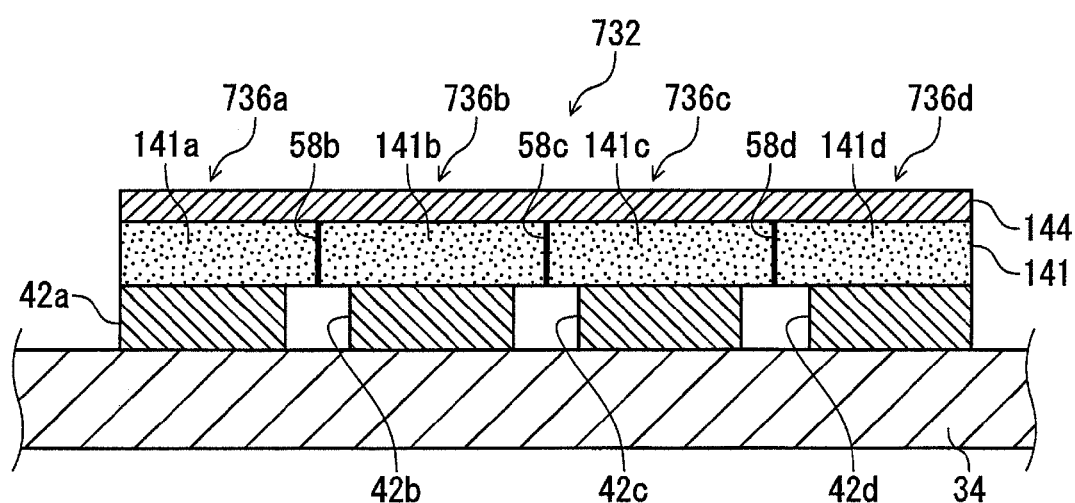
FIG. 12 is a cross-sectional view showing the main parts of another modification of the light emitting module according to the third embodiment.

FIG. 12 is a cross-sectional view showing the main parts of another modification of the light emitting module according to the third embodiment. The primary differences between the structure of this other modification and the structure of the light emitting module 432 shown in FIG. 9 will be described below. A light emitting module 732 includes first to fourth light emitting units 736a to 736d. Further, the light emitting module 732 includes a light guide body 141 that integrally covers the upper portions of semiconductor light emitting elements 42a to 42d including the first to fourth light emitting units 736a to 736d (hereinafter, appropriately referred to as light emitting units 736). The light guide body 141 has the same structure as the structure shown in FIG. 5, and is disposed between the phosphor layer 144 and the respective semiconductor light emitting elements 42.

Even though a part of the light, which is emitted from the semiconductor light emitting element 42a and enters the region 141a of the light guide body 141, is directed at the adjacent region 141b, the light is blocked by a light blocking portion 58b. Further, even though a part of the light, which is emitted from the semiconductor light emitting element 42b and enters the region 141b of the light guide body 141, is directed at the adjacent regions 141a and 141c, the light is blocked by light blocking portion 58b and 58c. Furthermore, even though a part of the light, which is emitted from the semiconductor light emitting element 42c and enters the region 141c of the light guide body 141, is directed at the adjacent regions 141b and 141d, the light is blocked by light blocking portion 58c and 58d. Moreover, even though a part of the light, which is emitted from the semiconductor light emitting element 42d and enters the region 141d of the light guide body 141, is directed at the adjacent region 141c, the light is blocked by a light blocking portion 58d. As a result, the light emitting module 732 has the same advantages as the advantages mentioned in the description of the light emitting module 32. In addition, because the light guide body 141, which is integrally formed, is provided on the respective semiconductor light emitting elements 42, it may be possible to more easily manufacture a light emitting module as compared with when light guide bodies are provided on the light emitting units 736, respectively. According to this structure, light emitted by the respective semiconductor light emitting elements 42a to 42d passes through the corresponding regions 141a to 141d of the light guide body 141, so that the diffusion of the light is suppressed. Further, since the semiconductor light emitting element 42 and the phosphor layer 144 are spaced apart from each other, the heat radiation property of the semiconductor light emitting element 42 or the phosphor layer 144 is improved, so that the characteristics of the entire light emitting module are improved.

Figure 13:
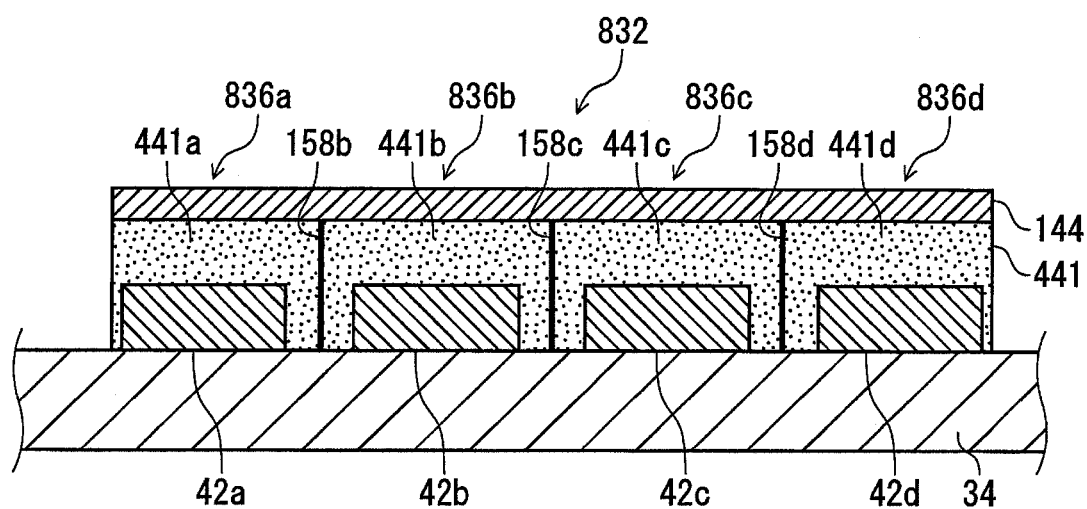
FIG. 13 is a cross-sectional view showing the main parts of another modification of the light emitting module according to the third embodiment.

FIG. 13 is a cross-sectional view showing the main parts of another modification of the light emitting module according to the third embodiment. The primary differences between the structure of another modification and the structure of the light emitting module 632 shown in FIG. 11 will be described below. A light emitting module 832 includes first to fourth light emitting units 836a to 836d. Further, the light emitting module 832 includes a light guide body 441 that integrally covers upper portions and side surfaces of semiconductor light emitting elements 42a to 42d including the first to fourth light emitting units 836a to 836d (hereinafter, appropriately referred to as light emitting units 836).

The light guide body 441 is partitioned into a plurality of regions 441a to 441d facing the respective semiconductor light emitting elements 42. Light blocking portions 158b to 158d are formed at boundaries between the respective regions 441a to 441d. Accordingly, even though a part of the light, which is emitted from the semiconductor light emitting element 42a and enters the region 441a of the light guide body 441, is directed at the adjacent region 441b, the light is blocked by the light blocking portion 158b. Further, even though a part of the light, which is emitted from the semiconductor light emitting element 42b and enters the region 441b of the light guide body 441, is directed at the adjacent regions 441a and 441c, the light is blocked by the light blocking portions 158b and 158c. Furthermore, even though a part of the light, which is emitted from the semiconductor light emitting element 42c and enters the region 441c of the light guide body 441, is directed at the adjacent regions 441b and 141d, the light is blocked by the light blocking portions 158c and 158d. Moreover, even though a part of the light, which is emitted from the semiconductor light emitting element 42d and enters the region 441d of the light guide body 441, is directed at the adjacent region 441c, the light is blocked by the light blocking portion 158d.

As a result, the light emitting module 832 has the same advantages as the advantages mentioned in the description of the light emitting module 32. In addition, since the light guide body 441, which is integrally formed, is provided on the respective semiconductor light emitting elements 42, it may be possible to more easily manufacture a light emitting module as compared with when light guide bodies are provided on the light emitting units 836, respectively. Further, because the side surfaces of the respective semiconductor light emitting elements 42 are covered with the respective regions 441a to 441d of the light guide body 441 in the light emitting module 832, it may be possible to also effectively use the light, which is emitted from the side surfaces of the respective semiconductor light emitting elements 42, to irradiate the front side.

(Fourth Embodiment)

Figure 14:
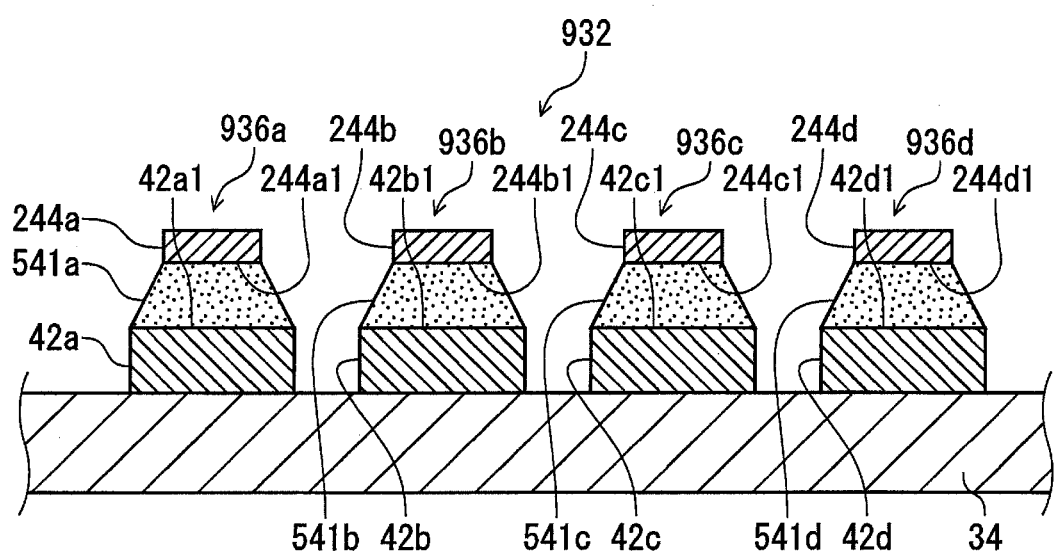
FIG. 14 is a cross-sectional view showing the main parts of a light emitting module according to a fourth embodiment.

FIG. 14 is a cross-sectional view showing the main parts of a light emitting module according to a fourth embodiment. Meanwhile, the same structure and advantages as those of the above-mentioned respective embodiments will be appropriately omitted. A light emitting module 932 according to this embodiment includes first to fourth light emitting units 936a to 936d. Moreover, in the light emitting module 932, the sizes of emission surfaces 42a1 to 42d1 of respective semiconductor light emitting elements 42a to 42d are different from those of incident surfaces 244a1 to 244d1 of corresponding phosphor layers 244a to 244d (hereinafter, appropriately referred to as phosphor layers 244). For this reason, the areas of the cross-sections, which are perpendicular to the light irradiation directions of the light emitting units, of light guide bodies 541a to 541d (hereinafter, appropriately referred to as light guide bodies 541), which are disposed between the semiconductor light emitting elements 42a to 42d and the phosphor layers 244a to 244d, respectively, decrease toward the phosphor layers 244. According to this structure, light emitted by each of the semiconductor light emitting elements 42 passes through the corresponding light guide body 541, so that the diffusion of the light is suppressed. Further, because the semiconductor light emitting element 42 and the phosphor layer 244 are spaced apart from each other, the heat radiation property of the semiconductor light emitting element 42 or the phosphor layer 244 is improved, so that the characteristics of the entire light emitting module are improved. Furthermore, since light emitted from the semiconductor light emitting element 42 is converged by the light guide body 541 and enters the phosphor layer 244, the luminance of light emitted from the phosphor layer 244 is increased.

Figure 15:
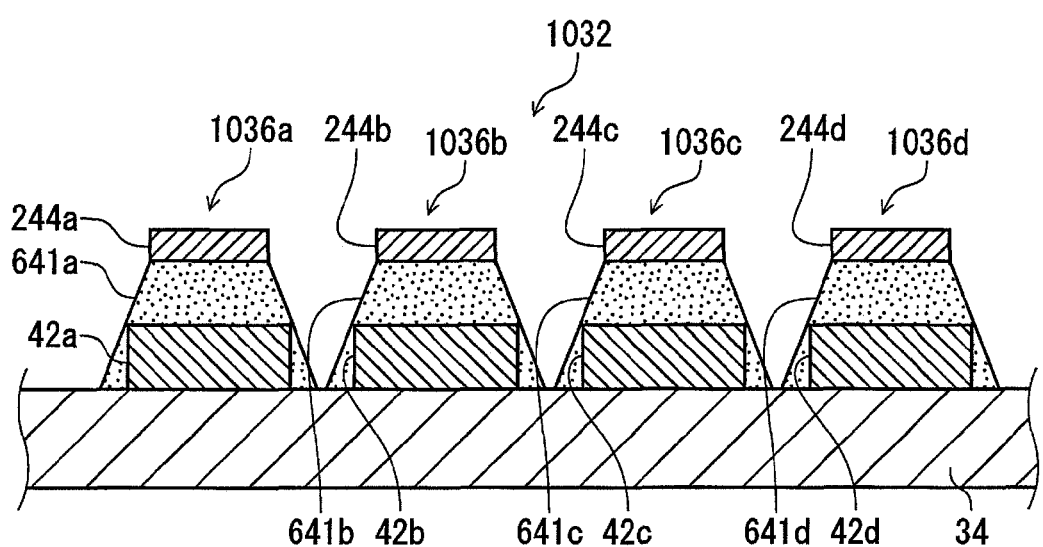
FIG. 15 is a cross-sectional view showing the main parts of a modification of the light emitting module according to the fourth embodiment.

FIG. 15 is a cross-sectional view showing the main parts of a modification of the light emitting module according to the fourth embodiment. The primary differences between the structure of this modification and the structure of the light emitting module 932 shown in FIG. 14 will be described below. A light emitting module 1032 includes first to fourth light emitting units 1036a to 1036d (hereinafter, appropriately referred to as light emitting units 1036). A light guide body 641a is provided so as to cover the upper surface and side surfaces of a semiconductor light emitting element 42a. A phosphor layer 244a is laminated on the upper surface of the light guide body 641a. A light guide body 641b is provided so as to cover the upper surface and side surfaces of a semiconductor light emitting element 42b. A phosphor layer 244b is laminated on the upper surface of the light guide body 641b. A light guide body 641c is provided so as to cover the upper surface and side surfaces of a semiconductor light emitting element 42c. A phosphor layer 244c is laminated on the upper surface of the light guide body 641c. A light guide body 641d is provided so as to cover the upper surface and side surfaces of a semiconductor light emitting element 42d. A phosphor layer 244d is laminated on the upper surface of the light guide body 641d.

Accordingly, the light emitting module 1032 has the same advantages as the advantages mentioned in the description of the light emitting module 932. Further, because the side surfaces of the respective semiconductor light emitting elements 42 are covered with the respective regions 641a to 641d in the light emitting module 1032, it may also be possible to effectively use the light, which is emitted from the side surfaces of the respective semiconductor light emitting elements 42, to irradiate the front side.

Figure 16:
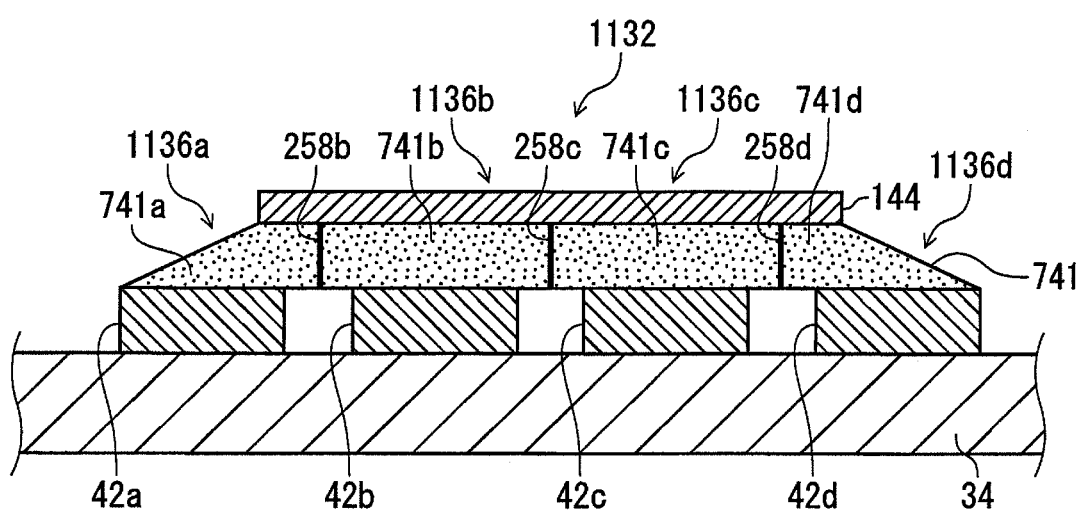
FIG. 16 is a cross-sectional view showing the main parts of another modification of the light emitting module according to the fourth embodiment.

FIG. 16 is a cross-sectional view showing the main parts of another modification of the light emitting module according to the fourth embodiment. The primary differences between the structure of this other modification and the structure of the light emitting module 732 shown in FIG. 12 will be described below. A light emitting module 1132 includes first to fourth light emitting units 1136a to 1136d (hereinafter, appropriately referred to as light emitting units 1136). Further, the light emitting module 1132 includes a light guide body 741 that integrally covers upper portions of semiconductor light emitting elements 42a to 42d including the first to fourth light emitting units 1136a to 1136d (hereinafter, appropriately referred to as light emitting units 1136). The light guide body 741 is disposed between a phosphor layer 144 and the respective semiconductor light emitting elements 42, and is partitioned into a plurality of regions 741a to 741d by light blocking portions 258b to 258c. Because the light guide body 741 has a structure similar to the structure of the light guide body 141 shown in FIG. 12, the light emitting module 1132 has the same advantages as the advantages of the light emitting module 732. Meanwhile, the area of the surface of the light guide body 741 facing the phosphor layer 144 is smaller than the area of the surface of the light guide body facing the respective semiconductor light emitting elements 42. For this reason, light emitted from the semiconductor light emitting elements 42a and 42d is converged by the regions 741a and the 741d of the light guide body 741 and enters the phosphor layer 144 in the first light emitting units 1136a and the fourth light emitting unit 1136d. Accordingly, the luminance of light emitted from the phosphor layer 144 is increased.

Figure 17:
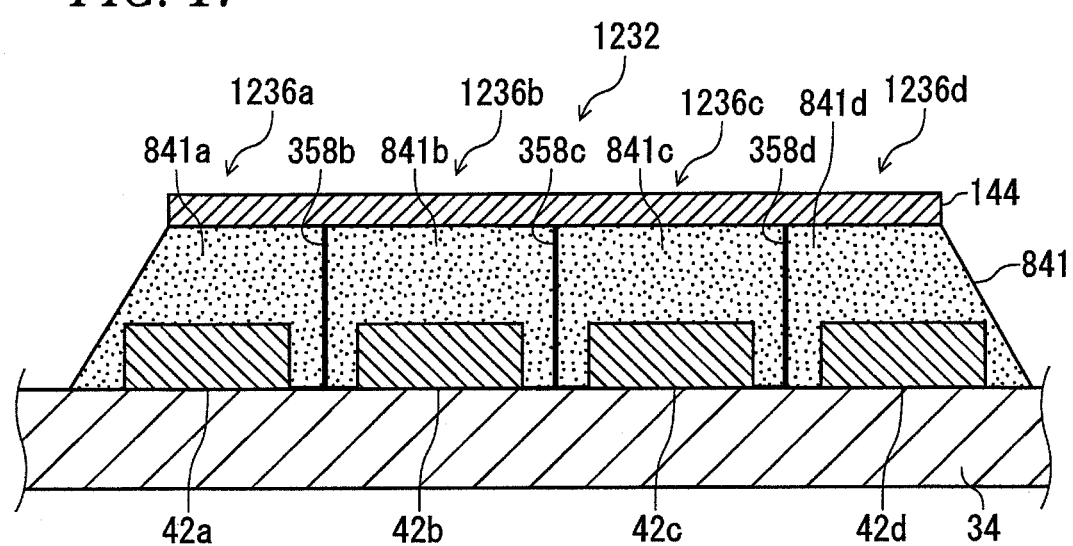
FIG. 17 is a cross-sectional view showing the main parts of another modification of the light emitting module according to the fourth embodiment.

FIG. 17 is a cross-sectional view showing the main parts of another modification of the light emitting module according to the fourth embodiment. The primary differences between the structure of another modification and the structure of the light emitting module 832 shown in FIG. 13 will be described below. A light emitting module 1232 includes first to fourth light emitting units 1236a to 1236d. Further, the light emitting module 1232 includes a light guide body 841 that integrally covers the upper surface and side surfaces of semiconductor light emitting elements 42a to 42d including the first to fourth light emitting units 1236a to 1236d (hereinafter, appropriately referred to as light emitting units 1236).

The light guide body 841 is partitioned into a plurality of regions 841a to 841d facing the respective semiconductor light emitting elements 42. Light blocking portions 358b to 358d are formed at boundaries between the respective regions 841a to 841d. Because the light guide body 841 has a structure similar to the structure of the light guide body 441 shown in FIG. 13, the light emitting module 1232 has the same advantages as the advantages of the light emitting module 832. Meanwhile, the area of the surface of the light guide body 841 facing the phosphor layer 144 is smaller than the area of the surface of the light guide body that comes into contact with upper surfaces of the respective semiconductor light emitting elements 42 facing the light guide body. For this reason, light emitted from the semiconductor light emitting elements 42a and 42d is converged by the regions 841a and the 841d of the light guide body 841 and enters the phosphor layer 144 in the first light emitting units 1236a and the fourth light emitting unit 1236d. Accordingly, the luminance of light emitted from the phosphor layer 144 is increased.

(Fifth Embodiment)

Figure 18:
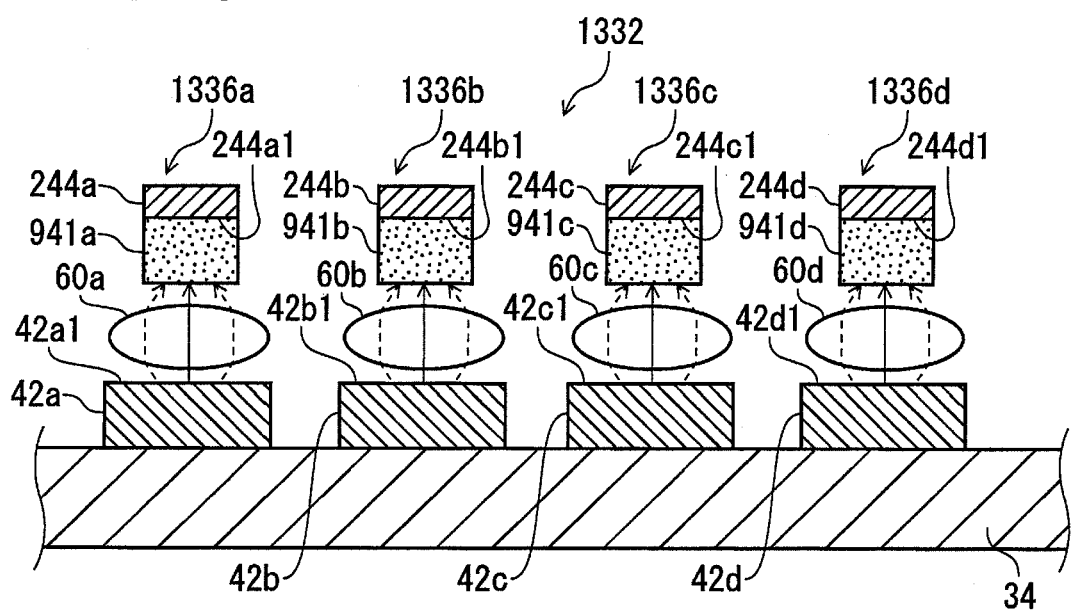
FIG. 18 is a cross-sectional view showing the main parts of a light emitting module according to a fifth embodiment.

FIG. 18 is a cross-sectional view showing the main parts of a light emitting module according to a fifth embodiment. A light emitting module according to this embodiment converges light, which is emitted from semiconductor light emitting elements, using optical components such as lenses or prisms and directs the light to light guide bodies. The light emitting module 1332 according to this embodiment includes first to fourth light emitting units 1336a to 1336d (hereinafter, appropriately referred to as light emitting units 1336).

The first light emitting unit 1336a includes a semiconductor light emitting element 42a that is supported by a substrate 34, a convex lens 60a that is provided so as to face the light emitting surface of the semiconductor light emitting element 42a, a light guide body 941a that is provided on the emission side of the convex lens 60a, and a phosphor layer 244a that is laminated on the emission side of the light guide body 941a. The second light emitting unit 1336b includes a semiconductor light emitting element 42b that is supported by the substrate 34, a convex lens 60b that is provided so as to face the light emitting surface of the semiconductor light emitting element 42b, a light guide body 941b that is provided on the emission side of the convex lens 60b, and a phosphor layer 244b that is laminated on the emission side of the light guide body 941b. The third light emitting unit 1336c includes a semiconductor light emitting element 42c that is supported by the substrate 34, a convex lens 60c that is provided so as to face the light emitting surface of the semiconductor light emitting element 42c, a light guide body 941c that is provided on the emission side of the convex lens 60c, and a phosphor layer 244c that is laminated on the emission side of the light guide body 941c. The fourth light emitting unit 1336d includes a semiconductor light emitting element 42d that is supported by the substrate 34, a convex lens 60d that is provided so as to face the light emitting surface of the semiconductor light emitting element 42d, a light guide body 941d that is provided on the emission side of the convex lens 60d, and a phosphor layer 244d that is laminated on the emission side of the light guide body 941d.

Further, the areas of emission surfaces 42a1 to 42a1 of the respective semiconductor light emitting elements 42 are equal to or larger than the areas of incident surfaces 244a1 to 244d1 of the corresponding phosphor layers 244. Meanwhile, the convex lenses 60a to 60d are appropriately referred to as convex lenses 60. Furthermore, the light guide bodies 941a to 941d are appropriately referred to as light guide bodies 941.

Light emitted from the semiconductor light emitting element 42 is focused by the convex lens 60 and enters the light guide body 941. The light entering the light guide body 941 passes through the phosphor layer 244, which includes an incident surface below the light emitting surface of the semiconductor light emitting element 42, and is emitted to the front side. Even if the light emitted from the semiconductor light emitting element 42 is diffused, the light is reliably focused on the phosphor layer 244 by the convex lens 60 and the light guide body 941 due to this structure. Accordingly, the leakage of the light, which is emitted from each of the phosphor layers 244, to a predetermined irradiation region of the adjacent light emitting unit 1336 is suppressed. Therefore, according to the light emitting module 1332 of this embodiment, it may be possible to achieve desired light distribution characteristics with high accuracy. As a result, when some light emitting units 1336 of the light emitting module 1332 are turned off and the other light emitting units 1336 are turned on, the leakage of light of the light emitting units 1336, which are turned on, to the irradiation regions of the light emitting units 1336, which are turned off, is suppressed. Therefore, the circumstances contributing to the glare, which is directed at vehicles traveling in front or pedestrians existing in the illuminated regions, are improved. Further, because the light emitted from the semiconductor light emitting element 42 is converged by the convex lens 60 and enters the phosphor layer 244, the luminance of light emitted from the phosphor layer 244 is increased.

(Sixth Embodiment)

Figure 19:
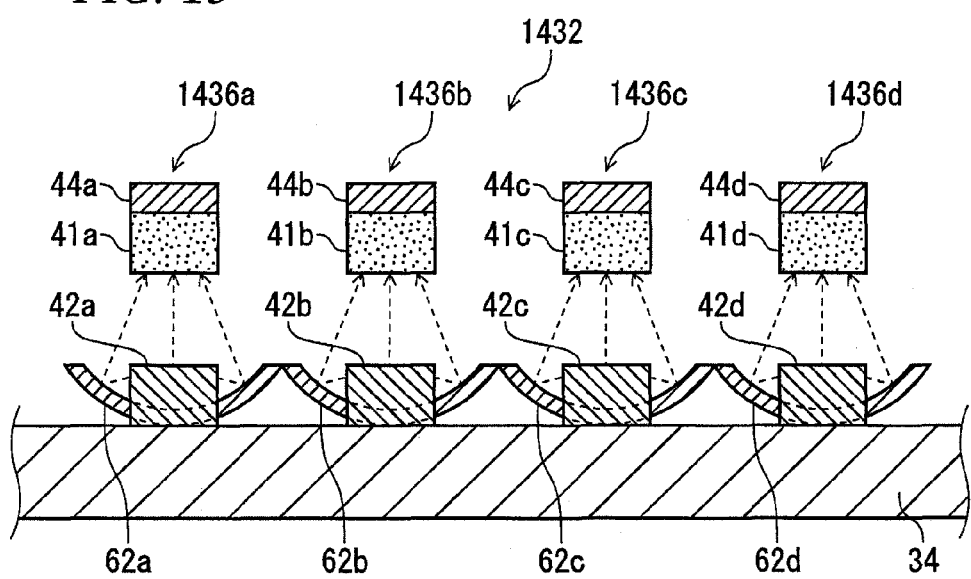
FIG. 19 is a cross-sectional view showing the main parts of a light emitting module according to a sixth embodiment.

FIG. 19 is a cross-sectional view showing the main parts of a light emitting module according to a sixth embodiment. A light emitting module according to this embodiment converges light, which is emitted from the side surfaces of the semiconductor light emitting elements, by reflectors and directs the light to light guide bodies. The primary differences between the structure of this embodiment and the structure of the light emitting module 532 shown in FIG. 10 will be described below. A light emitting module 1432 according to this embodiment includes first to fourth light emitting units 1436*a* to 1436*d* (hereinafter, appropriately referred to as light emitting units 1436).

The first light emitting unit 1436*a* includes a semiconductor light emitting element 42*a* that is supported by a substrate 34, a reflector 62*a* that is provided so as to enclose the semiconductor light emitting element 42*a*, a light guide body 41*a* that is provided on the emission side of the semiconductor light emitting element 42*a* with a gap between itself and the semiconductor light emitting element, and a phosphor layer 44*a* that is laminated on the emission side of the light guide body 41*a*. The second light emitting unit 1436*b* includes a semiconductor light emitting element 42*b* that is supported by the substrate 34, a reflector 62*b* that is provided so as to enclose the semiconductor light emitting element 42*b*, a light guide body 41*b* that is provided on the emission side of the semiconductor light emitting element 42*b* with a gap between itself and the semiconductor light emitting element, and a phosphor layer 44*b* that is laminated on the emission side of the light guide body 41*b*. The third light emitting unit 1436*c* includes a semiconductor light emitting element 42*c* that is supported by the substrate 34, a reflector 62*c* that is provided so as to enclose the semiconductor light emitting element 42*c*, a light guide body 41*c* that is provided on the emission side of the semiconductor light emitting element 42*c* with a gap between itself and the semiconductor light emitting element, and a phosphor layer 44*c* that is laminated on the emission side of the light guide body 41*c*. The fourth light emitting unit 1436*d* includes a semiconductor light emitting element 42*d* that is supported by the substrate 34, a reflector 62*d* that is provided so as to enclose the semiconductor light emitting element 42*d*, a light guide body 41*d* that is provided on the emission side of the semiconductor light emitting element 42*d* with a gap between itself and the semiconductor light emitting element, and a phosphor layer 44*d* that is laminated on the emission side of the light guide body 41*d*. Meanwhile, the reflectors 62*a* to 62*d* are appropriately referred to as reflectors 62. Further, the light guide bodies 41*a* to 41*d* are appropriately referred to as light guide bodies 41.

Even when the light emitted from the semiconductor light emitting element 42 is emitted to the sides from the side surfaces of the semiconductor light emitting element in the light emitting unit 1436, the light is reflected by the reflector 62 and enters the light guide body 41. The light entering the light guide body 41 passes through the phosphor layer 44 and is emitted to the front side. Even if the light emitted from the semiconductor light emitting element 42 is emitted from the side surfaces of the semiconductor light emitting element, the light is reliably focused on the phosphor layer 44 by the reflector 62 and the light guide body 41 due to this structure. Accordingly, the leakage of the light, which is emitted from each of the phosphor layers 44, to a predetermined irradiation region of the adjacent light emitting unit 1436 is suppressed. Therefore, according to the light emitting module 1432 of this embodiment, it may be possible to achieve desired light distribution characteristics with high accuracy. As a result, when some light emitting units 1436 of the light emitting module 1432 are turned off and the other light emitting units 1436 are turned on, the leakage of light of the light emitting units 1436, which are turned on, to the irradiation regions of the light emitting units 1436, which are turned off, is suppressed. Therefore, the circumstances contributing to the glare, which is directed at vehicles traveling in front or pedestrians existing in the regions, are improved.

(Vehicle Lamp)

Figure 20:
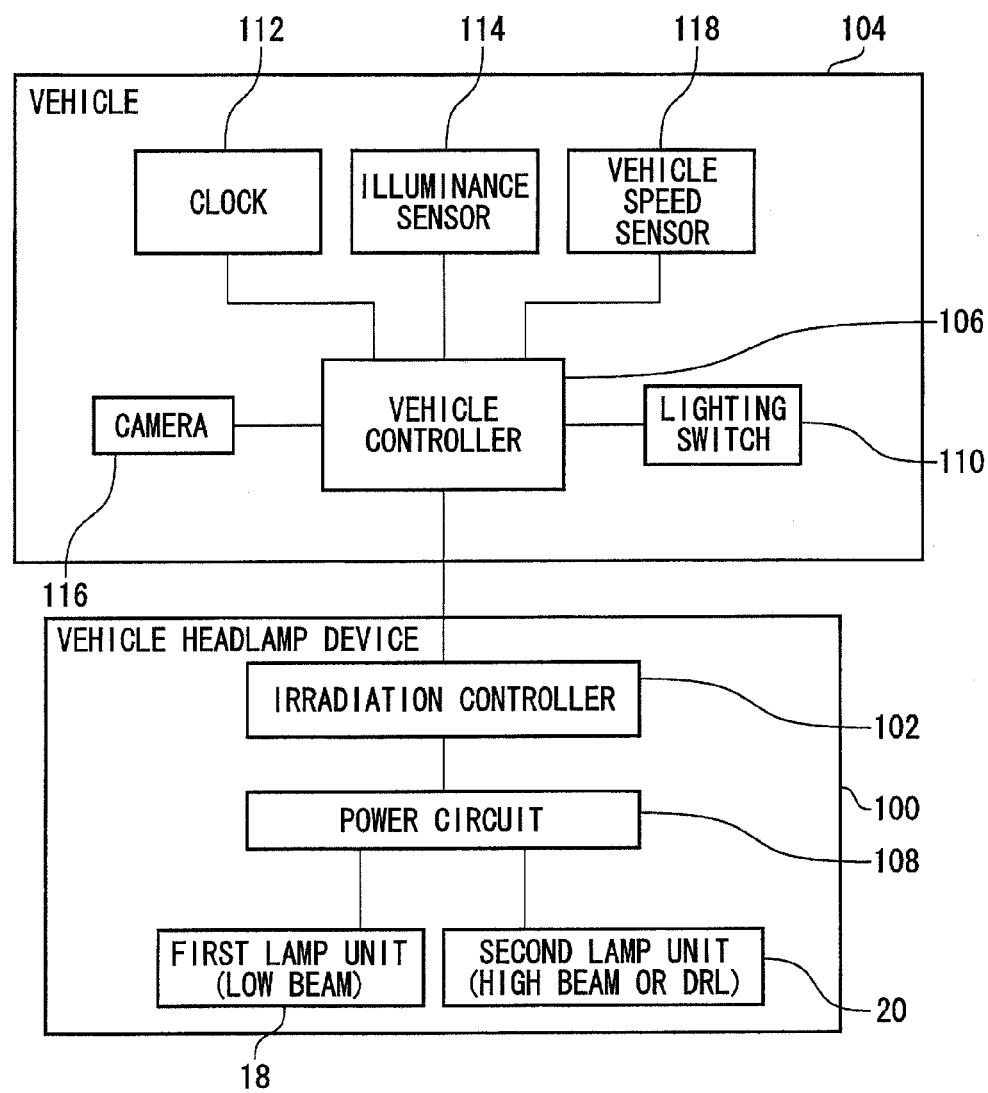
FIG. 20 is a functional block diagram illustrating the configuration of an irradiation controller of the vehicle headlamp device having the above-mentioned structure and a vehicle controller provided in a vehicle.

FIG. 20 is a functional block diagram illustrating the configuration of an irradiation controller of the vehicle headlamp device having the above-mentioned structure and a vehicle controller provided in a vehicle. An irradiation controller 102 of a vehicle headlamp device 100 controls the irradiation of a first lamp unit 18 or a second lamp unit 20 by controlling a power circuit 108 in accordance with the instruction of a vehicle controller 106 mounted on a vehicle 104.

A lighting switch 110, a clock 112, an illuminance sensor 114, a camera 116, and a vehicle speed sensor 118 are connected to the vehicle controller 106. The lighting switch 110 is a switch that manually perform the switching of low-beam irradiation caused by the turning-on/off of the first lamp unit 18, the switching of high-beam irradiation caused by the turning-on/off of the second lamp unit 20 when the first lamp unit 18 is turned on, and the switching of DRL irradiation caused by the turning-on/off of the second lamp unit 20 when the first lamp unit 18 is turned off.

The vehicle headlamp device 100 of this embodiment detects the circumstances around the vehicle 104 and may control the turning-on/off of the first lamp unit 18 or the second lamp unit 20 even when the lighting switch 110 is not operated. For example, the clock 112 provides the current date and time or the current season and time to the vehicle controller 106. If the vehicle controller 106 determines that the surroundings of the vehicle 104 are dark and the vehicle headlamp device 100 should be turned on based on the date and time or the season, the vehicle controller may send an instruction for turning on the first lamp unit 18 to the irradiation controller 102 so that a low-beam is automatically turned on. Meanwhile, if the vehicle controller 106 determines that the surroundings of the vehicle are bright and the vehicle headlamp device 100 does not need to be turned on, the vehicle controller may send an instruction for dimming the second lamp unit 20 to the irradiation controller 102 so that a DRL is automatically turned on. Further, the vehicle controller 106 may automatically switch irradiation to high-beam irradiation from low-beam irradiation based on information obtained from the camera 116, if vehicles or pedestrians do not exist in front of the vehicle.

If an object requiring suppression of irradiation exists in a high-beam irradiation region when the first and second lamp units 18 and 20 are turned on as described above in this embodiment, the turning-off of the second lamp unit 20 corresponding to the position of the object is controlled on a partial region. Here, the object requiring suppression of irradiation is an oncoming vehicle, a vehicle traveling in front, a pedestrian, or the like. The vehicle controller 106 uses image data that is provided from the camera 116, such as a stereo camera, as means for recognizing an object, in order to control the turning-off. A photographing region of the camera 116 corresponds to a region of a virtual vertical screen. If an image including feature points, which are previously stored and represent a vehicle or a pedestrian, exists in a photographed image, it is determined that an object requiring suppression of irradiation exists in a high-beam irradiation region. Further, information is provided to the irradiation controller 102 so that the irradiation controller turns off the light emitting unit 36, which forms a partial region corresponding to the position of the object requiring suppression of irradiation. Meanwhile, because means for detecting an object requiring suppression of irradiation in a high-beam irradiation region may be appropriately changed, other detecting means such as a millimeter-wave radar or an infrared radar may be used instead of the camera 116. Further, the millimeter-wave radar and the infrared radar may be combined with each other. Furthermore, the brightness of the surroundings of the vehicle 104 is detected on the basis of the information obtained from the camera 116, and the switching between the high-beam irradiation mode and the daytime lighting irradiation mode may be controlled.

Meanwhile, in this embodiment, a vehicle headlamp device as a vehicle lamp includes a control circuit that individually controls the light of a plurality of light emitting units of a light emitting module. Meanwhile, when the plurality of light emitting units of the light emitting module is divided into a plurality of groups, the control circuit may individually control the light of the groups. The vehicle headlamp device includes the above-mentioned light emitting module, so that it may be possible to achieve the desired light distribution characteristics with high accuracy.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims In the above-mentioned embodiments, there has been described a light emitting unit that is formed by the combination of the semiconductor light emitting element emitting blue light and the yellow phosphor. However, the light emitting unit may be a light emitting unit including a semiconductor light emitting element that emits ultraviolet light, and a plurality of phosphors that is excited by ultraviolet light and emits red light, green light, and blue light, respectively. Alternatively, the light emitting unit may be a light emitting unit including a semiconductor light emitting element that emits ultraviolet light, and a plurality of phosphors that is excited by ultraviolet light and emits blue light and yellow light, respectively.

Further, in the above-mentioned embodiments, a ceramic material has been used as the material of the optical wavelength conversion member. However, the mixture of a silicon resin or glass, a sol/gel agent, and a powder phosphor, which is machined in the shape of a plate, may be used as the optical wavelength conversion member instead of the ceramic material. Meanwhile, it is preferable that the light transmittance of the phosphor layer at a wavelength of 600 nm be equal to or larger than 40%. Further, the light emitting module according to this embodiment may be used for not only a vehicle lamp, but also, an illumination lamp.

What is claimed is:

1. A vehicle lamp comprising:
   a light emitting module comprising:
      a plurality of light emitting units, each of which comprise semiconductor light emitting elements that emit light; and
      a substrate that supports the plurality of light emitting units in an arrangement,
      wherein the light emitting units include light guide portions that guide light emitted by the semiconductor light emitting elements so that light emitted by the semiconductor light emitting elements is not directed at irradiation regions of adjacent light emitting units; and
   a control circuit that individually controls the light of a plurality of semiconductor light emitting elements of the light emitting module.

2. The light emitting module according to claim 1, wherein the control circuit individually controls the light of a plurality of semiconductor light emitting elements of the light emitting module based on a driver's operation or information obtained from a device that detects forward-positioned vehicles.

3. A light emitting module comprising:
   a plurality of light emitting units, each of which comprise semiconductor light emitting elements that emit light; and
   a substrate that supports the plurality of light emitting units in an arrangement,
   wherein the light emitting units include light guide portions that guide light emitted by the semiconductor light emitting elements so that light emitted by the semiconductor light emitting elements is not directed at irradiation regions of adjacent light emitting units, and
   wherein one or more of the plurality of light emitting units are respectively grouped together, and wherein respective groups of light emitting units are turned on and off individually.

4. A light emitting module comprising:
   a plurality of light emitting units, each of which comprise semiconductor light emitting elements that emit light; and
   a substrate that supports the plurality of light emitting units in an arrangement,
   wherein the light emitting units include light guide portions that guide light emitted by the semiconductor light emitting elements so that light emitted by the semiconductor light emitting elements is not directed at irradiation regions of adjacent light emitting units, and
   wherein the respective light guide portions are provided between an optical wavelength conversion member and the respective semiconductor light emitting elements.

5. The light emitting module according to claim 4, wherein the plurality of light emitting units are arranged so as to be linearly disposed on the substrate.

6. The light emitting module according to claim 4, wherein the plurality of light emitting units are formed in a rectangular shape.

7. The light emitting module according to claim 4, wherein light emitting units are turned on and off individually.

8. The light emitting module according to claim 4, wherein the respective light guide portions are integrally formed.

9. The light emitting module according to claim 4, further comprising: light blocking portion formed at a boundary between each of the light guide portions.

10. The light emitting module according to claim 4, wherein the light guide portions integrally cover upper portions of semiconductor light emitting elements.

11. A light emitting module comprising:
a plurality of light emitting units, each of which comprise semiconductor light emitting elements that emit light; and
a substrate that supports the plurality of light emitting units in an arrangement,
wherein the light emitting units include light guide portions that guide light emitted by the semiconductor light emitting elements so that light emitted by the semiconductor light emitting elements is not directed at irradiation regions of adjacent light emitting units, and
wherein the light emitting module further comprises:
a plurality of phosphor layers respectively disposed on each of the plurality of light emitting units.

12. The light emitting module according to claim 11, wherein sizes of emission surfaces of respective semiconductor light emitting elements are different from sizes of incident surfaces of corresponding phosphor layers.

13. The light emitting module according to claim 11 further comprising: light blocking portion formed at a boundary between each of the plurality of phosphor layers.

14. The light emitting module according to claim 11, wherein the plurality of light emitting units are arranged so as to be linearly disposed on the substrate.

15. The light emitting module according to claim 11, wherein the plurality of light emitting units are formed in a rectangular shape.

16. The light emitting module according to claim 11, wherein light emitting units are turned on and off individually.

17. The light emitting module according to claim 11, wherein the respective light guide portions are integrally formed.

18. The light emitting module according to claim 11 further comprising:
light blocking portion formed at a boundary between each of the light guide portions.

19. A light emitting module comprising:
a plurality of light emitting units, each of which comprise semiconductor light emitting elements that emit light; and
a substrate that supports the plurality of light emitting units in an arrangement,
wherein the light emitting units include light guide portions that guide light emitted by the semiconductor light emitting elements so that light emitted by the semiconductor light emitting elements is not directed at irradiation regions of adjacent light emitting units,
wherein the light emitting module further comprises: a plurality of convex lenses provided so as to respectively face a light emitting surface of each of the plurality of semiconductor light emitting elements, and
wherein the light guide portions are respectively provided on an emission side of the plurality of convex lenses.

20. The light emitting module according to claim 19 further comprising:
a plurality of phosphor layers respectively laminated on an emission side of the respective light guide portions.

* * * * *